(12) United States Patent
Kawasaki et al.

(10) Patent No.: US 10,854,767 B2
(45) Date of Patent: Dec. 1, 2020

(54) SOLAR CELL AND METHOD FOR MANUFACTURING SAME

(71) Applicant: KANEKA CORPORATION, Osaka (JP)

(72) Inventors: Hayato Kawasaki, Settsu (JP); Kunta Yoshikawa, Settsu (JP); Kunihiro Nakano, Settsu (JP); Katsunori Konishi, Settsu (JP); Kenji Yamamoto, Settsu (JP)

(73) Assignee: KANEKA CORPORATION, Osaka (JP)

( * ) Notice: Subject to any disclaimer, the term of this patent is extended or adjusted under 35 U.S.C. 154(b) by 307 days.

(21) Appl. No.: 15/556,469

(22) PCT Filed: Mar. 7, 2016

(86) PCT No.: PCT/JP2016/057042
§ 371 (c)(1),
(2) Date: Sep. 7, 2017

(87) PCT Pub. No.: WO2016/158226
PCT Pub. Date: Oct. 6, 2016

(65) Prior Publication Data
US 2018/0069144 A1   Mar. 8, 2018

(30) Foreign Application Priority Data
Mar. 31, 2015   (JP) .................................. 2015-074454

(51) Int. Cl.
*H01L 31/068*   (2012.01)
*H01L 31/0747*   (2012.01)
(Continued)

(52) U.S. Cl.
CPC .... *H01L 31/0682* (2013.01); *H01L 31/02167* (2013.01); *H01L 31/022441* (2013.01);
(Continued)

(58) Field of Classification Search
CPC ........... H01L 31/0682; H01L 31/02167; H01L 31/022441; H01L 31/0352;
(Continued)

(56) References Cited

U.S. PATENT DOCUMENTS

2012/0012179 A1*  1/2012  Asaumi ........... H01L 31/022441
                                                          136/256
2013/0137211 A1   5/2013  Mishima
(Continued)

FOREIGN PATENT DOCUMENTS

JP   2005-268683 A   9/2005
JP   2007-134655 A   5/2007
(Continued)

OTHER PUBLICATIONS

International Search Report dated Apr. 12, 2016 for PCT/JP2016/057042.

(Continued)

*Primary Examiner* — Magali P Slawski
*Assistant Examiner* — Kourtney R S Carlson
(74) *Attorney, Agent, or Firm* — Hauptman Ham, LLP

(57) ABSTRACT

The solar cell includes an n-type semiconductor layer and a p-type semiconductor layer on a first principal surface of a crystalline silicon substrate. The n-type semiconductor layer is provided so as to extend over a part on a p-type semiconductor layer-formed region provided with the p-type semiconductor layer, and a p-type semiconductor layer non-formed-region where the p-type semiconductor layer is not provided. In a region where the n-type semiconductor layer is provided on the p-type semiconductor layer, a protecting layer is between the p-type semiconductor layer and the n-type semiconductor layer. The protecting layer includes: an underlying protecting layer that is in contact with the p-type semiconductor layer; and an insulating layer (Continued)

that is on the underlying protecting layer. The underlying protecting layer includes an intrinsic silicon-based layer or an n-type silicon-based layer.

11 Claims, 4 Drawing Sheets

(51) Int. Cl.
  *H01L 31/20* (2006.01)
  *H01L 31/18* (2006.01)
  *H01L 31/0216* (2014.01)
  *H01L 31/0224* (2006.01)
  *H01L 31/0352* (2006.01)

(52) U.S. Cl.
  CPC .... *H01L 31/0352* (2013.01); *H01L 31/03529* (2013.01); *H01L 31/0747* (2013.01); *H01L 31/1804* (2013.01); *H01L 31/1896* (2013.01); *H01L 31/20* (2013.01); *H01L 31/202* (2013.01); *Y02E 10/547* (2013.01); *Y02P 70/50* (2015.11)

(58) Field of Classification Search
  CPC ........... H01L 31/03529; H01L 31/0747; H01L 31/1804; H01L 31/1896; H01L 31/20; H01L 31/202
  USPC .................. 136/242–265; 438/57, 71, 72
  See application file for complete search history.

(56) References Cited

U.S. PATENT DOCUMENTS

| | | | |
|---|---|---|---|
| 2013/0146136 A1 | 6/2013 | Seo et al. | |
| 2014/0020740 A1 | 1/2014 | Hasegawa et al. | |
| 2014/0020753 A1 | 1/2014 | Goto et al. | |
| 2014/0096821 A1* | 4/2014 | Chen | H01L 31/02168 |
| | | | 136/256 |
| 2014/0166094 A1 | 6/2014 | Loscutoff et al. | |

FOREIGN PATENT DOCUMENTS

| | | |
|---|---|---|
| JP | 2011-204832 A | 10/2011 |
| JP | 2012-28718 A | 2/2012 |
| JP | 2013-26269 A | 2/2013 |
| JP | 2013-125964 A | 6/2013 |
| JP | 2014-75526 A | 4/2014 |
| WO | 2012/132835 A1 | 1/1920 |
| WO | 2012/132854 A1 | 10/2012 |

OTHER PUBLICATIONS

International Preliminary Report on Patentability with Written Opinion of the International Searching Authority dated Oct. 12, 2017 corresponding to International Application No. PCT/JP2016/057042.

* cited by examiner

SOLAR CELL AND METHOD FOR MANUFACTURING SAME

CROSS REFERENCE TO RELATED APPLICATION

This application claims the priority of Japanese Patent Application No. 2015-074454, filed on Mar. 31, 2015 in the Japan Patent Office. Further, this application is the National Phase application of International Application No. PCT/JP2016/057042 filed on Mar. 7, 2016, which is incorporated herein by reference in its entirety.

TECHNICAL FIELD

The present invention relates to a solar cell and a method for manufacturing the same.

BACKGROUND ART

A general crystalline silicon-based solar cell is a double-sided electrode type solar cell, which includes a p-type semiconductor layer on one surface of a crystalline silicon substrate and an n-type semiconductor layer on the other surface of the crystalline silicon substrate, and either the p-layer-side or the n-layer-side is set to a light-receiving surface. On each of the light-receiving surface and the back surface, a metal electrode is provided for efficiently extracting a current. When sunlight is captured from the light-receiving surface, electron-hole pairs are generated in the crystalline silicon substrate, and a current is extracted through an electrode provided on each of the p-layer and the n-layer. In a double-sided electrode type solar cell, shielding (shadowing loss) of sunlight by a metal electrode on the light-receiving side is a factor of reducing conversion efficiency.

As a solar cell free from shadowing loss by a metal electrode, a back electrode (back-contact) type solar cell is being developed in which both p-type semiconductor layer and n-type semiconductor layer are provided on the back side of a crystalline silicon substrate, and respective electrodes are formed on the semiconductor layers. In the back-contact type solar cell, it is not necessary to provide an electrode on the light-receiving side, and therefore sunlight-receiving efficiency can be enhanced to improve conversion efficiency.

In the back-contact type solar cell, it is necessary to form both p-type semiconductor layer and n-type semiconductor layer on the back side. Thus, a method is desired which ensures that a wide effective region is secured, little leakage occurs between p-type and n-type layers, and layers can be patterned by simple steps.

FIG. 4 is a process conceptual view of a method for preparing a back-contact type solar cell disclosed in Patent Document 1. First, as shown in FIG. 4(a), an intrinsic semiconductor layer 2 is formed on the light-receiving side of a crystalline silicon substrate 1, and an intrinsic semiconductor layer 5a and a first conductivity-type semiconductor layer 6 are formed in this order on the back side of the crystalline silicon substrate 1. Next, as shown in FIG. 4(b), a light-receiving-side protecting layer 4 is formed on the intrinsic semiconductor layer 2 on the light-receiving side, and an insulating layer 8a is formed on the first conductivity-type semiconductor layer 6 on the back side.

Next, as shown in FIG. 4(c), the insulating layer 8a on the back side is partially removed by etching. Subsequently, as shown in FIG. 4(d), the first conductivity-type semiconductor layer 6 and the intrinsic semiconductor layer 5a are partially removed by etching to expose the crystalline silicon substrate 1.

Thereafter, as shown in FIG. 4(e), an intrinsic semiconductor layer 5b and a second conductivity-type semiconductor layer 7 are formed on substantially the entire surface on the back side which includes the first conductivity-type semiconductor layer 6 and the insulating layer 8a. As shown in FIG. 4(f), the second semiconductor layer 7 and the intrinsic semiconductor layer 5b on the insulating layer 8a are partially removed by etching. Thereafter, as shown in FIG. 4(g), the first conductivity-type semiconductor layer 6 is exposed by etching the insulating layer 8a with the second conductivity-type semiconductor layer 7 as a mask. Through the above steps, semiconductor layers (p-layer and n-layer) in a pattern shape can be formed on the back side of the silicon substrate (see FIG. 2). Finally, as shown in FIG. 4(h), an electrode is formed on the first conductivity-type semiconductor layer 6 and the second conductivity-type semiconductor layer 7 to complete a back-contact type solar cell.

The insulating layer 8a is composed of a silicon alloy such as silicon oxide, silicon nitride or silicon oxynitride, and is removed by etching using an acid-based etchant (etching agent) such as a hydrofluoric acid (HF) aqueous solution. The first conductivity-type semiconductor layer 6 and the second conductivity-type semiconductor layer 7 are composed of, for example, conductive silicon. In a step of etching the insulating layer 8a (FIG. 4(g)), the second conductivity-type semiconductor layer 7 is used as an etching mask, and etching is ended at the time when the first conductivity-type semiconductor layer 6 is exposed, whereby formation of a mask layer for pattern-etching the insulating layer 8a can be omitted.

PRIOR ART DOCUMENT

Patent Document

Patent Document 1: Japanese Patent Laid-open Publication No. 2012-028718

SUMMARY OF THE INVENTION

Problems to be Solved by the Invention

As a result of conducting studies, the present inventors have found that preparation of a back-contact type solar cell by the method described in Patent Document 1 has the following problem. Specifically, the problems such as increase of resistance, decreases of the open circuit voltage, and so on arises, when SiO is formed as an insulating layer on a p-type semiconductor layer as a first conductivity-type semiconductor layer, an n-type semiconductor layer is formed thereon as a second conductivity-type semiconductor layer, and the insulating layer on the p-type semiconductor layer is then removed using an acid-based etchant such as hydrofluoric acid.

In view of the situations described above, an object of the present invention is to provide a back-contact type solar cell in which deterioration of properties due to patterning is suppressed.

Means for Solving the Problems

It is considered that in the method in Patent Document 1, an etchant during patterning of an insulating layer comes into contact with a p-type semiconductor layer to give damage, resulting in deterioration of properties. By providing an intrinsic silicon-based layer or/and an n-type silicon-based layer as an underlying layer between a p-type semiconductor layer and an insulating layer, an etchant used for etching the insulating layer can be prevented from coming into contact with the p-type semiconductor layer. Thus, a back-contact type crystalline silicon-based solar cell having an improved contact resistance and open circuit voltage is obtained.

The present invention relates to a solar cell including an n-type semiconductor layer and a p-type semiconductor layer on a first principal surface of a crystalline silicon substrate, and a method for manufacturing the solar cell. On the first principal surface of the crystalline silicon substrate, the n-type semiconductor layer is provided so as to extend over a part of a p-type semiconductor layer-formed region provided with the p-type semiconductor layer, and a p-type semiconductor layer-non-formed region where the p-type semiconductor layer is not provided. In a region where the n-type semiconductor layer is provided on the p-type semiconductor layer (i.e., region where the p-type semiconductor layer-formed region and an n-type semiconductor layer-formed region overlap each other), a protecting layer is provided between the p-type semiconductor layer and the n-type semiconductor layer. Preferably, the protecting layer contains an underlying layer and an insulating layer in this order from the p-type semiconductor layer-side, wherein the protecting layer includes at least one of an intrinsic silicon-based layer and an n-type silicon-based layer.

The underlying layer in the protecting layer (underlying protecting layer) is preferably an intrinsic silicon-based layer. Preferably, the insulating layer in the protecting layer is composed of at least one selected from silicon oxide, silicon nitride and silicon oxynitride. The p-type semiconductor layer is preferably a p-type silicon-based layer.

The manufacturing method according to the present invention includes the steps in order: forming on a first principal surface of a crystalline silicon substrate a p-type semiconductor layer-formed region provided with a p-type semiconductor layer and a protecting layer in this order, and a p-type semiconductor layer-non-formed region where neither the p-type semiconductor layer nor the protecting layer is provided (pattern layer forming step); forming an n-type semiconductor layer on the first principal surface of the crystalline silicon substrate so as to cover the p-type semiconductor layer-formed region provided with the p-type semiconductor layer, and the p-type semiconductor layer-non-formed-region where neither the p-type semiconductor layer is not provided (n-type semiconductor layer forming step); partially removing the n-type semiconductor layer on the p-type semiconductor layer so that the protecting layer on the p-type semiconductor layer is partially exposed (n-type semiconductor layer patterning step); and removing the exposed protecting layer on the p-type semiconductor layer so that the p-type semiconductor layer is partially exposed (protecting layer patterning step).

In one embodiment, the pattern layer forming step includes the steps of forming a p-type semiconductor layer on a first principal surface of a crystalline silicon substrate (p-type semiconductor layer forming step); forming a protecting layer on a first principal surface of the p-type semiconductor layer (protecting layer forming step); and partially removing the p-type semiconductor layer on the first principal surface of the crystalline silicon substrate (p-type semiconductor layer patterning step), in this order. The step of partially removing the protecting layer to expose the p-type semiconductor layer between protecting layers (p-layer exposure patterning step) may be carried out after the protecting layer is formed on the entire surface of the p-type semiconductor layer and before the p-type semiconductor layer is removed.

Preferably, the insulating layer and the underlying protecting layer are sequentially removed using different etchants in the protecting layer patterning step. Preferably, an etchant that exhibits a higher etching rate for the insulating layer than for the underlying protecting layer is used for etching of the insulating layer. Preferably, an etchant that exhibits a higher etching rate for the underlying protecting layer than for the p-type semiconductor layer is used for etching of the underlying protecting layer after removal of the insulating layer. Preferably, the etchant used for removal of the underlying protecting layer exhibits a higher etching rate for the underlying protecting layer than for the insulating layer.

Preferably, the insulating layer is etched using an acid-based etchant containing hydrofluoric acid. Preferably, the underlying protecting layer is etched using an alkali-based etchant containing KOH, NaOH or the like after the insulating layer is removed.

Effects of the Invention

As a protecting layer for a p-type semiconductor layer, a predetermined underlying protecting layer and insulating layer are provided in this order from the p-type semiconductor layer-side, so that etching of the insulating layer can be stopped by the underlying protecting layer. Thus, an etchant used for etching of the insulating layer can be prevented from coming into contact with the p-type semiconductor layer, and as a result, an increase in contact resistance and a decrease in open circuit voltage can be suppressed.

MODE FOR CARRYING OUT THE INVENTION

Hereinafter, a preferred embodiment of the present invention will be described. The following embodiment is illustrative only, and the present invention is in no way limited to the following embodiment.

Figure 1:
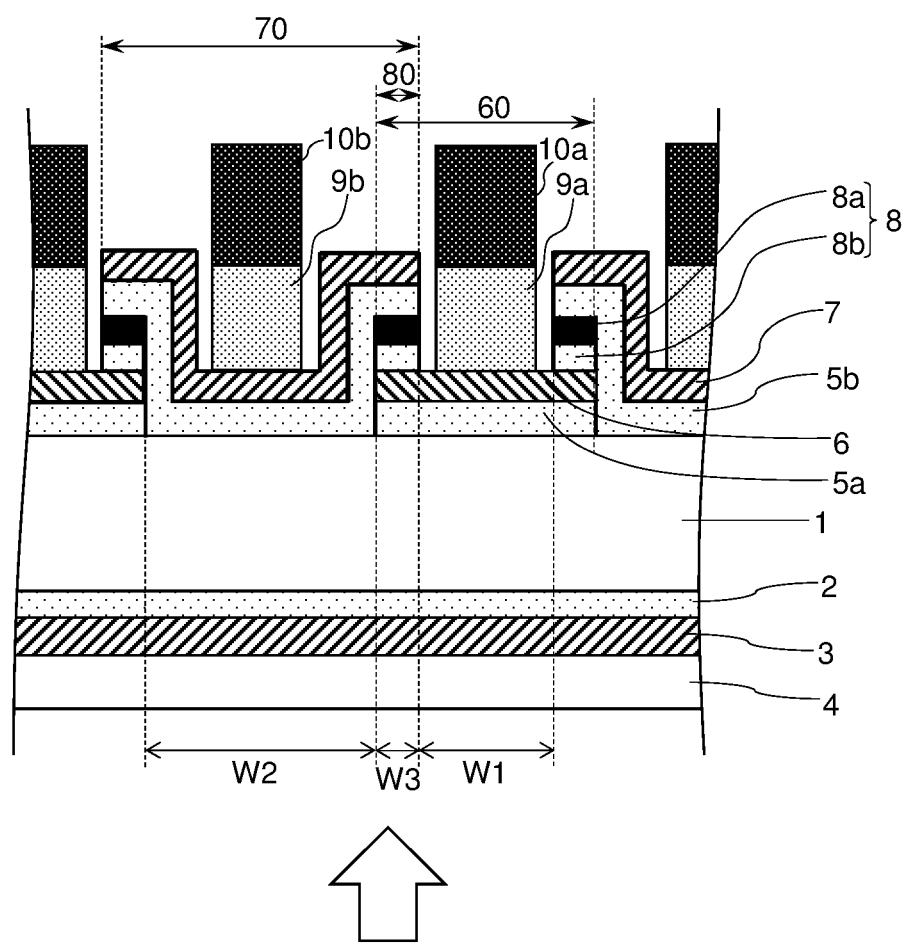
FIG. 1 is a schematic sectional view showing a solar cell according to one embodiment of the present invention.
Figure 2:
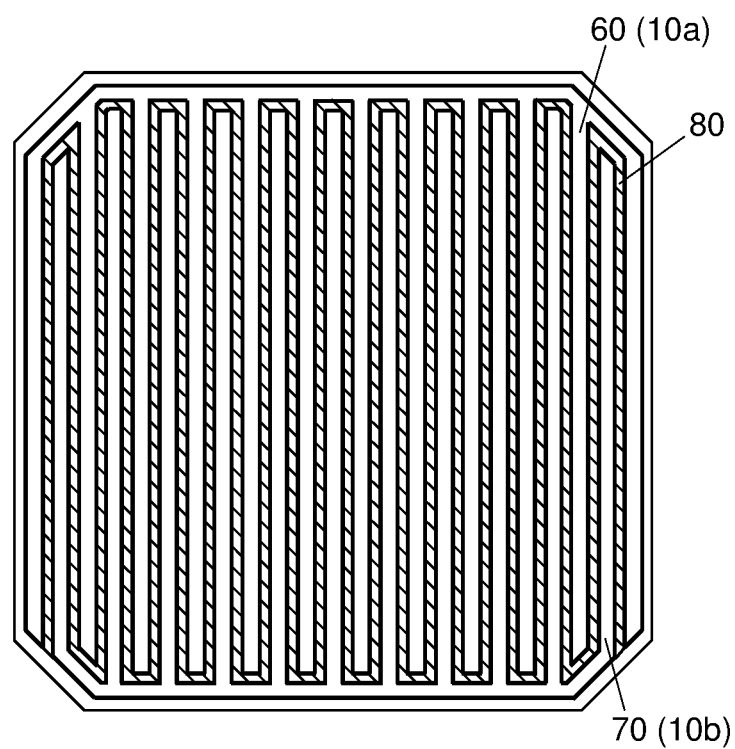
FIG. 2 is a schematic plan view showing one example of a shape of a semiconductor layer-formed region in a back-contact type solar cell.

FIG. 2 is a schematic plan view for explaining shapes of a p-type semiconductor layer-formed region and an n-type semiconductor layer-formed region in a back-contact type solar cell, where the back-contact type solar cell before formation of an electrode is viewed from the first principal surface-side. FIG. 1 is a schematic sectional view showing a back-contact type solar cell according to one embodiment of the present invention, which corresponds to a cross-section in a transverse direction in FIG. 2. The arrow in FIG. 1 shows a direction in which sunlight is incident. Specifically, the lower part (second principal surface) in FIG. 1 corresponds to a light-receiving surface that receives sunlight, and the upper part (first principal surface) in FIG. 1 corresponds to a back surface of a solar cell. In FIG. 2, a p-type semiconductor layer 6-formed region 60 and an n-type semiconductor layer 7-formed region 70 are provided in the shape of interdigitated comb teeth. The p-type semiconductor layer-formed region and the n-type semiconductor layer formed region are not required to have a comb shape, and may have, for example, a shape in which a portion connecting comb teeth (so called a bus bar portion) is not provided. As shown in FIG. 1, a protecting layer 8 is provided in a boundary region (protecting layer-formed region 80) where the p-type semiconductor layer-formed region and the n-type semiconductor layer-formed region overlap each other.

In the back-contact type solar cell shown in FIG. 1, intrinsic silicon-based layers 5a and 5b, a p-type semiconductor layer 6, an n-type semiconductor layer 7, a protecting layer 8, first electrodes 9a and 9b and second electrodes 10a and 10b are provided on a first principal surface of a crystalline silicon substrate 1. The layers on the first principal surface are patterned.

The n-type semiconductor layer 7 is provided so as to extend over a protecting layer-formed region 80 as a part of a region (p-type semiconductor layer-formed region 60) provided with the p-type semiconductor layer 6, and a region (p-type semiconductor layer-non-formed region) where the p-type semiconductor layer is not provided. In other words, the n-type semiconductor layer 7 is provided so as to extend over the entire of the p-type semiconductor layer-non-formed region, and two p-type semiconductor layer-formed regions adjacent to the p-type semiconductor layer-non-formed region.

A region (hatched region in FIG. 2) where the p-type semiconductor layer-formed region 60 and the n-type semiconductor layer-formed region 70 overlap each other is the protecting layer-formed region 80, and the protecting layer 8 is provided between the p-type semiconductor layer 6 and the n-type semiconductor layer 7. The protecting layer 8 includes an underlying protecting layer 8b provided in contact with the p-type semiconductor layer 6, and an insulating layer 8a in this order from the p-type semiconductor layer 6-side. Preferably, the insulating layer 8a is provided in contact with the underlying protecting layer 8b. The underlying protecting layer 8b includes at least one of an intrinsic silicon-based layer and an n-type silicon-based layer. The underlying protecting layer 8b may have a stacking configuration of the intrinsic silicon-based layer and the n-type silicon-based layer. p-side electrodes 9a and 10a are provided on the p-type semiconductor layer 6, and n-side electrodes 9b and 10b are provided on the n-type semiconductor layer 7.

The width of the p-type semiconductor layer-formed region 60 and the width of the n-type semiconductor layer-formed region 70 are not particularly limited, and may be equal to or different from each other. The width of each of these regions may vary depending on a location. The width of the protecting layer-formed region 80 (region where the p-type semiconductor layer-formed region and the n-type semiconductor layer-formed region overlap each other) is not particularly limited. The width W3 of the protecting layer-formed region 80 is set to, for example, about 10 to 500 μm. The width W1 of a region left after excluding protecting layer-formed regions on both ends from the p-type semiconductor layer-formed region 60, and the width W2 of a region left after excluding protecting layer-formed regions on both ends from the n-type semiconductor layer-formed region 70 are each set to, for example, about 100 to 1500 μm.

Figure 3:
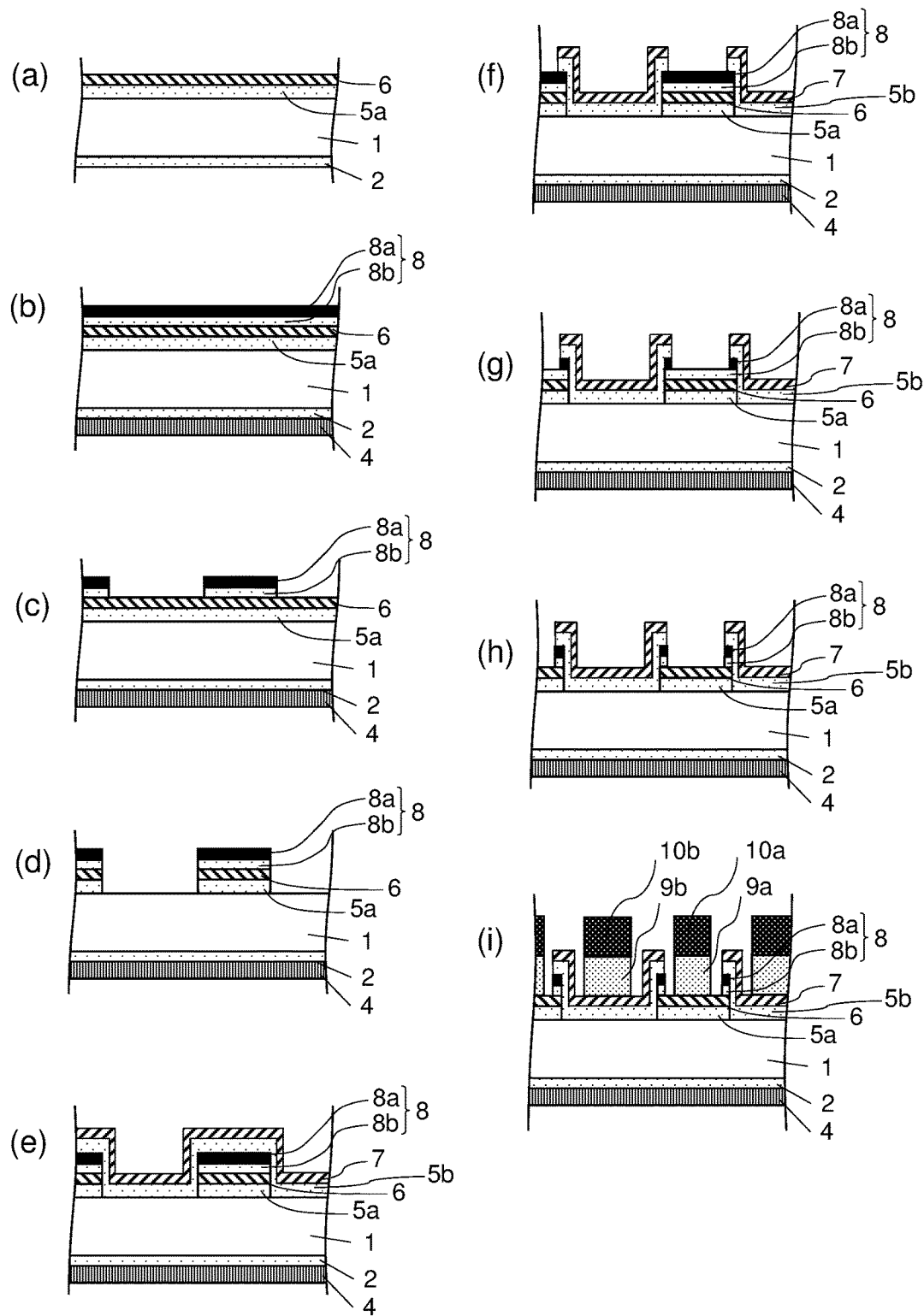
FIG. 3 is a process conceptual view showing manufacturing steps in one embodiment of the present invention.

FIG. 3 is a process conceptual view for explaining a manufacturing step of the back-contact type solar cell shown in FIG. 1. Hereinafter, steps of preparing a solar cell according to one embodiment of the present invention will be described with reference to these drawings.

First, the crystalline silicon substrate 1 is provided. The crystalline silicon substrate may be either of a single-crystalline silicon substrate and a polycrystalline silicon substrate. The conductivity-type of the crystalline silicon substrate may be either an n-type or a p-type. In examples shown below, an n-type single-crystalline silicon substrate is used. Preferably, a textured structure is formed on a surface of the crystalline silicon substrate 1. The texture may be formed on any of the first principal surface and the second principal surface, or formed on both the surfaces.

[Formation and Patterning of Layers on First Principal Surface]

<Pattern Layer Forming Step>

As shown in FIG. 3(d), a p-type semiconductor layer-formed region provided with the p-type semiconductor layer 6 and the protecting layer 8 in this order, and a p-type semiconductor layer-non-formed region where neither the p-type semiconductor layer nor the protecting layer is provided on the first principal surface of the crystalline silicon substrate 1. Preferably, an intrinsic silicon-based layer 5a is provided between the crystalline silicon substrate 1 and the p-type semiconductor layer 6 in the p-type semiconductor layer-formed region.

The p-type semiconductor layer 6 contains p-type dopant, and is preferably a p-type silicon-based layer containing boron. In particular, a p-type amorphous silicon layer is especially preferable for suppressing diffusion of impurities and reducing series resistance. On the amorphous silicon-based layer, a very small amount of microcrystalline silicon having a particle size of about 50 nm or less may be deposited. The thickness of the p-type semiconductor layer 6 is not particularly limited, and is set to, for example, about 3 to 50 nm.

The thickness in this specification is a thickness along a direction perpendicular to a deposition surface. When the principal surface is flat, the thickness direction is perpendicular to a principal surface. When the principal surface has a textured structure, etc., the thickness direction is perpendicular to the slope of the texture. The thickness of each layer can be measured by spectroscopic ellipsometry.

The intrinsic silicon-based layer 5a is preferably an intrinsic amorphous silicon layer including silicon and hydrogen. By depositing intrinsic hydrogenated amorphous silicon on the crystalline silicon substrate 1 by a CVD method, surface passivation can be effectively performed while diffusion of impurities to the crystalline silicon substrate is suppressed. Since the intrinsic silicon-based layer does not directly contribute to power generation, the thickness thereof is set within such a range that a passivation effect is obtained. The thickness of the intrinsic silicon-based layer is preferably about 1 to 50 nm, more preferably about 1 to 15 nm.

Examples of the method for forming a pattern layer with the intrinsic silicon-based layer 5a, p-type semiconductor layer 6 and protecting layer 8 stacked in a p-type semiconductor layer-formed region include the followings: a method in which a region corresponding to a p-type semiconductor layer-non-formed region is shielded with a mask and the layers are sequentially formed in a p-type semiconductor layer-formed region; and a method in which the layers formed on substantially the entire surface of the crystalline silicon substrate 1 are patterned by etching or the like.

Hereinafter, an embodiment in which a pattern layer is formed by etching the layers formed on substantially the entire surface of a substrate will be described with reference to FIGS. 3(a) to 3(d).

(p-Type Semiconductor Layer Forming Step)

As shown in FIG. 3(a), the p-type semiconductor layer 6 is formed on substantially the entire surface on the first principal surface-side of the crystalline silicon substrate 1. Preferably, the intrinsic silicon-based layer 5a is formed between the crystalline silicon substrate 1 and the p-type semiconductor layer 6 as described above. Herein, "substantially the entire surface" means 90% or more of the principal surface. The intrinsic silicon-based layer 5a and the p-type semiconductor layer 6 are formed preferably on a region constituting 95% or more of the first principal surface, preferably on the entire of the first principal surface. The entire surface means the entire region except for very small areas of deposition unevenness at the ends of the substrate, pinholes and the like which result from, for example, abnormal discharge during deposition.

(Protecting Layer Forming Step)

Next, as the protecting layer 8, the underlying protecting layer 8b and the insulating layer 8a are formed in this order from the p-type semiconductor layer-side on the p-type semiconductor layer 6 as shown in FIG. 3(b). The material of the insulating layer 8a is not particularly limited as long as it has an insulating property, and is capable of suppressing leakage between the p-type semiconductor layer 6 and the n-type semiconductor layer 7 in the p-type semiconductor layer-formed region. For facilitating patterning by etching, it is preferable that the insulating layer 8a contains a silicon alloy such as silicon oxide, silicon nitride or silicon oxynitride. It is preferable that the insulating layer 8a is mainly composed of any of these components. The term "mainly composed of" in this specification means that the content is higher than 50% by weight. In particular, the content is preferably 70% by weight or more, more preferably 85% by weight or more. Preferably, the insulating layer 8a includes a silicon oxide layer, a silicon nitride layer, a silicon oxynitride layer, or a stacked thereof. In particular, silicon oxide is especially preferable from the viewpoint of ease of etching processing.

In the present invention, as the protecting layer 8 for the p-type semiconductor layer, the underlying protecting layer 8b that is in contact with the p-type semiconductor layer 6 is provided in addition to the insulating layer 8a as described above. The underlying protecting layer 8b includes at least one of an intrinsic silicon-based layer and an n-type silicon-based layer. The intrinsic silicon-based layer is preferably an intrinsic amorphous silicon-based layer, especially preferably an intrinsic amorphous silicon layer. The n-type silicon-based layer is preferably an n-type amorphous silicon-based layer, especially preferably an n-type amorphous silicon layer. The underlying protecting layer 8b is especially preferably an intrinsic silicon-based layer for ensuring that the underlying protecting layer 8b as well as the insulating layer 8a has an effect of suppressing leakage between the p-type semiconductor layer 6 and the n-type semiconductor layer 7 in the p-type semiconductor layer-formed region.

The thickness of the underlying protecting layer 8b is not particularly limited as long as the p-type semiconductor layer 6 can be covered. The thickness of the underlying protecting layer 8b is set to, for example, about 1 to 50 nm. The thickness of the protecting layer 8, i.e., the total thickness of the underlying protecting layer 8b and the insulating layer 8a is not particularly limited as long as it is in such a range that insulation between the p-type semiconductor layer 6 and the n-type semiconductor layer 7 can be maintained by the protecting layer 8. The thickness of the protecting layer 8 is set to, for example, about 5 to 300 nm.

Both the intrinsic silicon-based layer and the n-type silicon-based layer can be etched with an alkali-based etchant, and have etching resistance to an acid-based etchant such as hydrofluoric acid. On the other hand, the p-type semiconductor layer 6 and the insulating layer 8a can be etched with an acid-based etchant, and have etching resistance to an alkali-based etchant. Thus, selective etching of the insulating layer 8a and the underlying protecting layer 8b can be easily performed in a protecting layer patterning step as described later. The p-type semiconductor layer 6 has high resistance to an alkali-based etchant. Therefore, the p-type semiconductor layer 6 exhibits high etching resistance during etching of the underlying protecting layer 8b using an alkali-based etchant, so that degradation of the p-type semiconductor layer can be suppressed.

(p-Type Semiconductor Layer Patterning Step)

As shown in FIG. 3(c), the protecting layer 8 is partially removed by etching (p-layer exposure patterning step). A region where the protecting layer 8 is removed corresponds to the p-type semiconductor layer-non-formed region. Accordingly, a protecting layer-formed region where the protecting layer 8 is left, and a protecting layer-non-formed region where the protecting layer is removed are provided. In the protecting layer-non-formed region, the p-type semiconductor layer is exposed. Examples of the method for partially removing the protecting layer include a method in which the surface of a region where the protecting layer is to be left is covered (protected) with a mask, a resist or the like, and a region other than the covered region (non-protected region) is then etched.

Subsequently, in the region where the protecting layer 8 is removed (protecting layer-non-formed region), the p-type semiconductor layer 6 exposed between protecting layers, and the intrinsic silicon-based layer 5a provided under the exposed p-type semiconductor layer 6 are removed by etching to expose the first principal surface of the crystalline silicon substrate 1 as shown in FIG. 3(d). Accordingly, a p-type semiconductor layer-formed region where the p-type semiconductor layer 6 (and intrinsic silicon-based layer 5a) is left, and a p-type semiconductor layer-non-formed region where the p-type semiconductor layer (and intrinsic silicon-based layer 5a) is removed are provided. As an etchant for removing the insulating layer 8a in the protecting layer 8, an acid-based etchant such as a hydrofluoric acid aqueous solution is preferably used. As an etchant for removing the p-type semiconductor layer, an etchant containing hydrofluoric acid is preferably used. In particular, a mixed acid of hydrofluoric acid and nitric acid is especially preferably used.

<Washing Step>

As shown in FIG. 3(d), the crystalline silicon substrate 1 is exposed in the p-type semiconductor layer-non-formed region after formation of the pattern layer in which the p-type semiconductor layer 6 and the protecting layer 8 are stacked. When the layers are patterned by etching, residue of etched film, etchant and so on may be deposited on the surface of the protecting layer 8 in the p-type semiconductor layer-formed region and the surface of the crystalline silicon substrate in the p-type semiconductor layer-non-formed region. Thus, it is preferable to carry out a substrate washing step after formation of the pattern layer and before formation of the n-type semiconductor layer. The washing liquid to be used in the washing step is not particularly limited as long as it is capable of cleaning the surface of the crystalline silicon substrate. Preferably, an aqueous solution containing hydrofluoric acid is used as the washing liquid because it has a high effect of washing the surface of the crystalline silicon substrate. When washing is performed using an aqueous solution containing hydrofluoric acid, it is preferable to form the insulating layer 8a with a large thickness beforehand with consideration given to the etching amount because the insulating layer 8a is etched by hydrofluoric acid.

<n-Type Semiconductor Layer Forming Step>

As shown in FIG. 3(e), the n-type semiconductor layer 7 is formed so as to cover the entire surface of the p-type semiconductor layer-formed region and the p-type semiconductor layer-non-formed region. The n-type semiconductor layer 7 contains an n-type dopant, and is preferably an n-type silicon-based layer containing phosphorus. In particular, the n-type semiconductor layer 7 is more preferably an n-type amorphous silicon-based layer, especially preferably an n-type amorphous silicon layer. The thickness of the n-type semiconductor layer 7 is not particularly limited. The thickness is set to, for example, about 3 to 50 nm. Preferably, the intrinsic silicon-based layer 5b is provided between the crystalline silicon substrate 1 and the p-type semiconductor layer 6. The intrinsic silicon-based layer 5b is preferably an intrinsic hydrogenated amorphous silicon layer including silicon and hydrogen. The thickness and the composition of the intrinsic silicon-based layer 5b may be identical to or different from the thickness and the composition of the intrinsic silicon-based layer 5a provided under the p-type semiconductor layer 6.

<n-Type Semiconductor Layer Patterning Step>

As shown in FIG. 3(f), the n-type semiconductor layer 7 on the protecting layer 8 is partially removed by etching. When the intrinsic silicon-based layer 5b is provided between the protecting layer 8 and the n-type semiconductor layer 7, the intrinsic silicon-based layer 5b is removed similarly to the n-type semiconductor layer 7. In etching of the n-type semiconductor layer, the surface of a region where the n-type semiconductor layer is to be left is covered with a mask, a resist or the like, and thereby protected from an etchant. For removing the n-type semiconductor layer 7 and the intrinsic silicon-based layer 5b, an alkali-based etchant containing KOH or NaOH is preferably used.

In the n-type semiconductor layer patterning step, the n-type semiconductor layer 7 and the intrinsic silicon-based layer 5b are removed at the width direction-central portion of the p-type semiconductor layer-formed region, which is provided with the p-type semiconductor layer 6 and the protecting layer 8. Accordingly, the protecting layer 8 is exposed between n-type semiconductor layers 7. In a region in the p-type semiconductor layer-formed region where the n-type semiconductor layer 7 is left, i.e., a region provided with both the p-type semiconductor layer 6 and the n-type semiconductor layer, the protecting layer 8 is provided between the p-type semiconductor layer 6 and the n-type semiconductor layer 7, and therefore leakage between p-type and n-type layers is suppressed.

<Protecting Layer Patterning Step>

After the n-type semiconductor layer patterning step, as shown in FIGS. 3(g) and 3(h), the exposed protecting layer 8 is removed by etching in a region where the n-type semiconductor layer is removed. Accordingly, the p-type semiconductor layer 6 is exposed between n-type semiconductor layers 7. In this step, it suffices that the p-type semiconductor layer 6 is exposed, and the protecting layer 8 on the p-type semiconductor layer-formed region is left. Preferably, the protecting layer that is exposed between n-type semiconductor layers is entirely removed.

First, as shown in FIG. 3(g), the insulating layer 8a is partially removed by etching to expose the underlying protecting layer 8b between insulating layers 8a. Subsequently, as shown in FIG. 3(h), the underlying protecting layer 8b exposed between insulating layers 8a (between n-type semiconductor layers 7) is removed by etching to expose the p-type semiconductor layer 6 between n-type semiconductor layers 7.

The etchant for removing the insulating layer 8a should be an etchant that gives little damage to the n-type semiconductor layer 7 etc. exposed to the p-type semiconductor layer-non-formed region. The etchant for removing the underlying protecting layer 8b should be an etchant that gives little damage to the p-type semiconductor layer 6 etc. provided under the underlying protecting layer 8b. Preferably, an etchant which exhibits a higher etching rate for the insulating layer than for the underlying protecting layer and which does not substantially dissolve the underlying protecting layer is used as the etchant for removing the insulating layer 8a. Preferably, an etchant which exhibits a higher etching rate for the underlying protecting layer than for the p-type semiconductor layer and which does not substantially dissolve the p-type semiconductor layer is used as the etchant for removing the underlying protecting layer 8b. Preferably, the etchant for removing the underlying protecting layer 8b exhibits a higher etching rate for the underlying protecting layer than the insulating layer, and does not substantially dissolve the insulating layer.

Preferably, an acid-based etchant such as hydrofluoric acid is used for removing the insulating layer 8a when the insulating layer 8a is composed of silicon oxide, silicon nitride, silicon oxynitride, or a stacked body thereof as described above. Silicon oxide, silicon nitride, silicon oxynitride or the like is etched at a high etching rate with an acid-based etchant, and at a low etching rate with an alkali-based etchant such as NaOH, KOH or the like. On the other hand, intrinsic silicon and n-type silicon that forms the underlying protecting layer 8b are etched at a low etching rate with an acid-based etchant, and therefore the underlying protecting layer 8b is not substantially etched with an acid-based etchant. Thus, when the insulating layer 8a is etched using an acid-based etchant, etching is stopped at the time when the underlying protecting layer 8b is exposed, so that selective etching can be performed.

Preferably, the underlying protecting layer 8b is etched using an alkali-based etchant after the insulating layer 8a is etched. Since an alkali-based etchant exhibits a high etching rate for intrinsic silicon and n-type silicon, the underlying protecting layer 8b can be easily etched with an alkali-based etchant. On the other hand, the p-type semiconductor layer 6 is etched at a low etching rate with an alkali-based etchant. When an alkali-based etchant is used, etching is stopped at the time when the p-type semiconductor layer 6 is exposed, and therefore the p-type semiconductor layer can be exposed by selectively etching the underlying protecting layer 8b while suppressing damage to the p-type semiconductor layer.

An alkali-based etchant exhibits a low etching rate for silicon oxide, silicon nitride, silicon oxynitride or the like in the insulating layer 8a, and therefore expansion of a region where the insulating layer 8a is removed during etching of the underlying protecting layer 8b is suppressed. Thus, the protecting layer 8 in which the underlying protecting layer 8b and the insulating layer 8a are stacked can be left between the p-type semiconductor layer 6 and the n-type semiconductor layer 7, so that leakage between p-type and n-type layers can be suppressed.

As shown in FIGS. 3(g) and 3(h), the n-type semiconductor layer 7 is exposed on the surface of the p-type semiconductor layer-non-formed region during the protecting layer patterning step. When an alkali-based etchant is used for removing the underlying protecting layer 8b, the n-type semiconductor layer 7 may also be etched. Preferably, the n-type semiconductor layer 7 is formed with a thickness larger than that of the underlying protecting layer 8b, or the n-type semiconductor layer 7 is covered with a mask, a resist or the like to be protected for preventing the n-type semiconductor layer 7 from being etched away during etching of the underlying protecting layer 8b.

<Electrode Forming Step>

After the semiconductor layer is formed as described above, electrodes 9a and 10a and electrodes 9b and 10b are formed on the p-type semiconductor layer 6 and the n-type semiconductor layer 7, respectively as shown in FIG. 3(i) (electrode forming step). Through the above steps, formation of the layers on the first principal surface of the back-contact type solar cell shown in FIG. 1 is completed.

[Comparison with Related Art]

Figure 4:
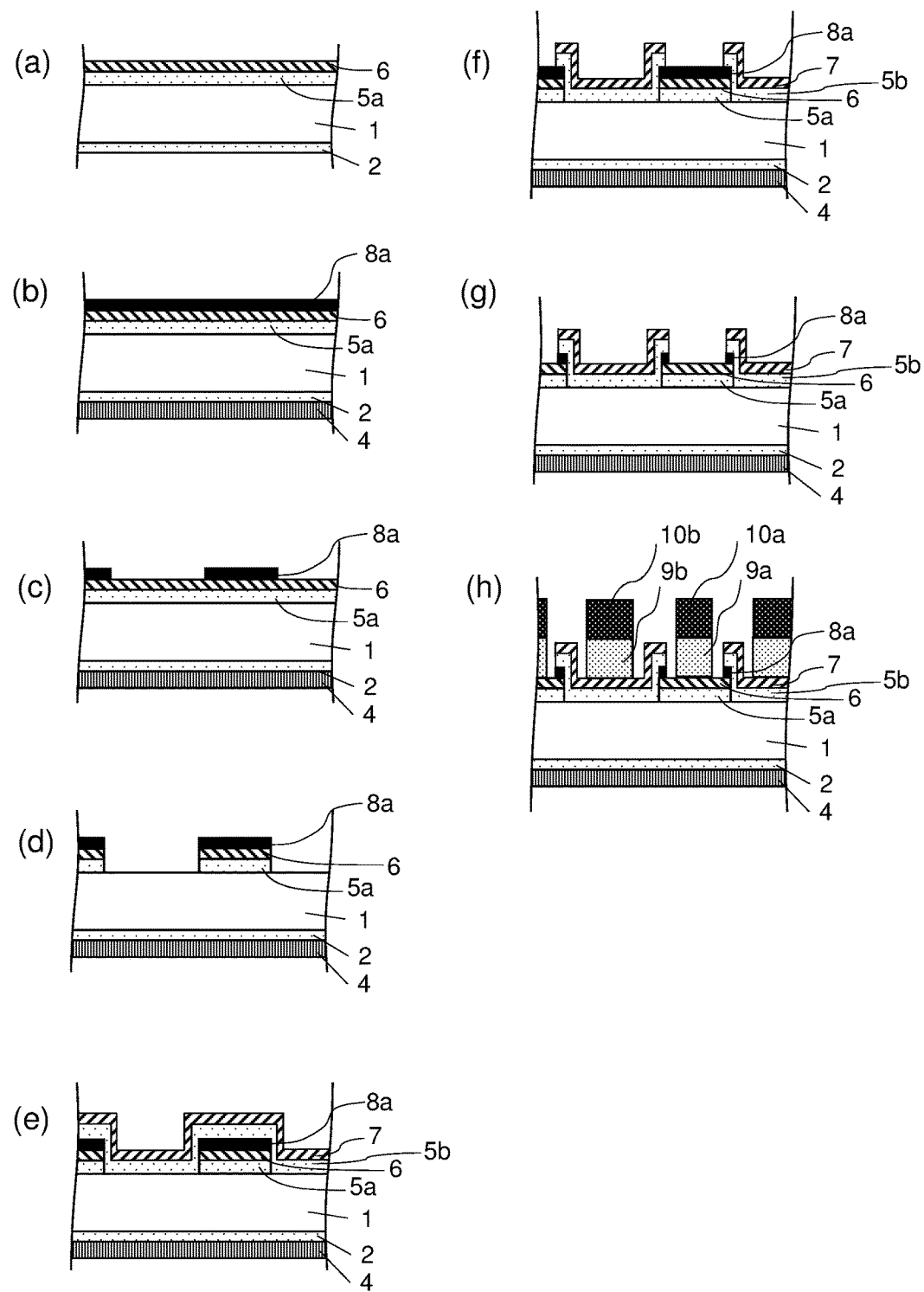
FIG. 4 is a process conceptual view showing steps of manufacturing a solar cell in a related art.

The exposed p-type semiconductor layer 6 after etching removal of the insulating layer is allowed to contact the etchant (see FIG. 4(g)), when the insulating layer 8a is provided as a protecting layer that is in contact with the p-type semiconductor layer 6 as shown in FIG. 4. As described above, the insulating layer 8a on the p-type semiconductor layer is etched in washing of a surface of the substrate using hydrofluoric acid after formation of the pattern layer, and therefore it is necessary to increase the deposition thickness for securing insulation between p-type and n-type layers. When thickness unevenness causes in deposition of the insulating layer, a thickness difference resulting from the unevenness increases in proportion to the deposition thickness, and therefore the etching completion time varies depending on a location. Thus, even when the substrate is taken out from the etchant immediately after etching of the insulating layer is completed, the p-type semiconductor layer is exposed for a long period of time to the etchant for removing the insulating layer in a region where the insulating layer has a small deposition thickness. If pinholes are generated during formation of the insulating layer, the etchant penetrating through the pinholes comes into contact with the p-type semiconductor layer. As described above, a p-type semiconductor material such as p-type amorphous silicon has lower resistance to an acid-based etchant such as hydrofluoric acid as compared to an intrinsic semiconductor material and an n-type semiconductor material, and therefore when the p-type semiconductor layer 6 is exposed to the etchant for removing the insulating layer, the properties of the solar cell tend to be deteriorated.

On the other hand, in the present invention, an intrinsic silicon-based layer or/and an n-type silicon-based layer is provided as the underlying protecting layer 8b between the p-type semiconductor layer 6 and the insulating layer 8a, and therefore even when the insulating layer 8a is etched, the p-type semiconductor layer 6 is not exposed, and thus can be protected from an etchant (see FIG. 3(g)). When the underlying protecting layer 8b covers substantially the entire surface of the p-type semiconductor layer 6, the underlying protecting layer 8b sufficiently functions as a protecting layer during etching, and therefore may have a thickness smaller than that of the insulating layer 8a. Thus, the underlying protecting layer 8b is less affected by thickness unevenness, and has smaller variations in etching completion time as compared to the insulating layer 8a. Thus, the contact time between the p-type semiconductor layer 6 and an etchant used for removing the underlying protecting layer 8b can be reduced.

For removing the underlying protecting layer 8b, an etchant (e.g., alkali-based etchant) that gives less damage to the p-type semiconductor layer as compared to hydrofluoric acid or the like for removing the insulating layer 8a can be used. Thus, deterioration of film quality of the p-type semiconductor layer 6 during etching of the protecting layer 8 is prevented, so that a solar cell having high efficiency can be prepared.

Since the underlying protecting layer 8b is composed of a material different from that of the insulating layer 8a, the underlying protecting layer 8b is formed in a step different from that for the insulating layer 8a. Even if pinholes are generated during deposition, the possibility that the pinholes are formed at a position identical to that of the underlying protecting layer 8b in the insulating layer 8a is low, so that penetration of an etchant into the p-type semiconductor layer 6 through the pinholes during etching of the insulating layer can be considerably reduced. Thus, by providing the underlying protecting layer 8b between the p-type semiconductor layer 6 and the insulating layer 8a, the probability of a short-circuit between p-type and n-type layers, which is caused by pinholes, is considerably reduced, so that an effect of further improving the properties of the solar cell is expected.

[Structure on Second Principal Surface]

In the back-contact type solar cell, the second principal surface that is a light-receiving surface does not directly contribute to power generation and extraction of currents. Thus, the structure on the second principal surface is not particularly limited as long as sunlight reception is not interfered. In the solar cell shown in FIG. 1, the intrinsic silicon-based layer 2, the conductive semiconductor layer 3 and the light-receiving-side protecting layer 4 are provided in this order on the second principal surface of the crystalline silicon substrate 1.

Preferably, the intrinsic silicon-based layer 2 is provided on the second principal surface of the crystalline silicon substrate 1 (FIG. 3(a)). The intrinsic silicon-based layer 2 is preferably an amorphous silicon layer. By providing the intrinsic silicon-based layer 2, the substrate surface can be effectively passivated. Since the intrinsic silicon-based layer 2 does not contribute to power generation, it is preferable that the thickness thereof is set so that a passivation effect is attained while light reception is not interfered. The thickness of the intrinsic silicon-based layer 2 is preferably about 1 to 50 nm, more preferably about 1 to 15 nm. When the intrinsic silicon-based layer 2 is formed on the light-receiving side, and the intrinsic silicon-based layer 5a on the back side, either the former or the latter may be formed first.

Preferably, the light-receiving-side protecting layer 4 that also functions as an antireflection layer is formed on the intrinsic silicon-based layer 2 (FIG. 3(b)). The material of the light-receiving-side protecting layer 4 is not particularly limited as long as it is capable of protecting layers (e.g., the intrinsic silicon-based layer 2 and conductive semiconductor layer 3) existing under the light-receiving-side protecting layer 4 in a process for manufacturing a solar cell, and has light-transmissivity. As the material of the light-receiving-side protecting layer 4, for example, a silicon alloy such as silicon oxide, silicon nitride or silicon oxynitride, or a mixture or stacked structure of the silicon alloys is preferable. In particular, silicon nitride is especially preferable from the viewpoint of antireflection and resistance to an etchant. Although the thickness of the light-receiving-side protecting layer 4 is not particularly limited, it is preferable to set the thickness in view of imparting an antireflection function to increase the amount of light captured in the crystalline silicon substrate 1, and the thickness of the light-receiving-side protecting layer 4 is preferably about 80 nm to 1 μm.

The conductive semiconductor layer 3 may be formed between the intrinsic silicon-based layer 2 and the light-receiving-side protecting layer 4 (FIG. 3(b)). Preferably, the conductive semiconductor layer 3 has a conductivity-type identical to that of the crystalline silicon substrate 1. For example, when the crystalline silicon substrate is an n-type crystalline silicon substrate, it is preferable that an n-type semiconductor layer is formed as the conductive semiconductor layer 3. The conductive semiconductor layer 3 is preferably a silicon-based layer, more preferably an amorphous silicon layer. The thickness of the conductive semiconductor layer 3 is set to, for example, about 1 to 50 nm.

[Method for Forming Layers]

A plasma-enhanced CVD method is preferably as a method for forming silicon-based layers such as the above-mentioned p-type silicon-based layer, n-type silicon-based layer and intrinsic silicon-based layer. When both the intrinsic silicon-based layer and the conductivity-type silicon-based layer are formed by a plasma-enhanced CVD method, simplification of steps and prevention of contamination can be expected because the intrinsic silicon-based layer 5a and the p-type semiconductor layer 6, the intrinsic silicon-based layer 5b and the n-type semiconductor layer 7, and the intrinsic silicon-based layer 2 on the light-receiving side and the conductive semiconductor layer 3 can be continuously formed respectively. The plasma-enhanced CVD method is capable of relatively easily controlling film quality by adjusting deposition conditions, and therefore improvement of an effect as the protecting layer and reduction of an optical loss by adjusting etching resistance and a refractive index can be expected.

Deposition conditions for forming the silicon-based layer by the plasma-enhanced CVD method are preferably the substrate temperature of 100 to 300° C., the pressure of 20 to 2600 Pa, and the high-frequency power density of 0.004 to 0.8 W/cm$^2$. As the raw material gas to be used for deposition of the silicon-based layer, a silicon-containing gas such as $SiH_4$ or $Si_2H_6$, or a mixed gas of a silicon-based gas and $H_2$ is preferable. As a dopant gas for forming the p-type or n-type silicon-based layer, $B_2H_6$, $PH_3$ or the like is preferably used. The addition amount of impurities such as P and B may be very small, and therefore it is preferable to use a mixed gas diluted with $SiH_4$ or $H_2$ beforehand. The energy gap of the silicon-based layer can also be changed by forming a silicon-based thin-film into an alloy by adding a gas containing different kinds of elements, such as $CH_4$, $CO_2$, $NH_3$ and $GeH_4$, during formation of the conductive silicon-based layer.

The method for forming the insulating layer 8a is not particularly limited. When a p-type silicon-based layer is formed as the p-type semiconductor layer 6 by a plasma-enhanced CVD method, it is preferable that the insulating layer 8a is also formed by a plasma-enhanced CVD method for improving productivity and reducing the amount of impurities. Preferably, the light-receiving-side protecting layer 4 is also formed by a plasma-enhanced CVD method.

As shown in FIGS. 1 and 3(i), a p-side electrode is formed on the p-type semiconductor layer 6, and an n-side electrode is formed on the n-type semiconductor layer 7. Preferably, the p-side electrode and the n-side electrode have stacked structures of transparent electroconductive films as first electrodes 9a and 9b, respectively and metal layers as second electrodes 10a and 10b, respectively.

Preferably, the transparent electroconductive film as the first electrode is mainly composed of a conductive oxide. As the conductive oxide, for example, zinc oxide, indium oxide, tin oxide and the like can be used singly, or in mixture thereof. From the viewpoint of conductivity, optical properties and long-term reliability, an indium-based oxide mainly composed of indium oxide is preferable, and in particular, an indium-based oxide mainly composed of indium tin oxide (ITO) is more preferably used. The transparent electroconductive film may be a single layer or a stack of plurality of layers. The thickness of each of first electrodes 9a and 9b is not particularly limited, and is set to, for example, about 10 to 100 nm.

Although the method for forming the transparent electroconductive film is not particularly limited, physical vapor deposition methods such as a sputtering method, chemical vapor deposition (MOCVD) methods using a reaction of an organic metal compound with oxygen or water, and so on are preferable. In any of the methods for forming the transparent electroconductive film, energy from heat or plasma discharge can be used. The substrate temperature during formation of the transparent electroconductive film is appropriately set. The substrate temperature is preferably 200° C. or lower in view of the heat-resistant temperature of the silicon-based layer of amorphous silicon etc.

For the metal layer as the second electrode, a metal such as Ag or Cu is used. The metal layer is formed by a sputtering method, a printing method, a plating method or the like. The metal layer may be a single layer or may have a stacking configuration with a plurality of layers. The thickness of the metal layer is not particularly limited, and is set to, for example, about 50 nm to 3 μm.

EXAMPLES

Hereinafter, the present invention will be described more in detail based on comparison between an example in which a crystalline silicon solar cell shown in FIG. 1 is prepared through steps shown in FIG. 3 and a comparative example in which a crystalline silicon-based solar cell is prepared through steps shown in FIG. 4. The present invention is not limited to the example described below.

Example

A 200 μm-thick n-type single-crystalline silicon substrate having a (100) plane orientation on the incidence surface was immersed in a 2 wt % hydrofluoric acid aqueous solution for 3 minutes to remove a silicon oxide film on a surface of the substrate, and then rinsed with ultrapure water twice. The substrate was immersed for 15 minutes in a 5/15 wt % KOH/isopropyl alcohol aqueous solution held at 70° C., thereby obtaining a single-crystalline silicon substrate having pyramidal texture with (111) plane exposed on a surface thereof.

The texture-formed substrate was introduced into a CVD apparatus, and an i-type amorphous silicon layer was formed to have a thickness of 10 nm as an intrinsic silicon-based thin-film 2 on the light-receiving surface (second principal surface) side. Thereafter, an i-type amorphous silicon layer was formed to have a thickness of 8 nm as an intrinsic silicon-based thin-film 5a on the back surface (first principal surface) side. Deposition conditions for forming these i-type amorphous silicon layers included a substrate temperature of 150° C., a pressure of 120 Pa, a $SiH_4/H_2$ flow ratio of 3/10 and a power density supply of 0.011 W/cm². The thickness of the thin-film in this example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer 5a, a p-type amorphous silicon layer was formed to have a thickness of 7 nm as a p-type semiconductor layer 6. Deposition conditions for forming the p-type amorphous silicon layer included a substrate temperature of 150° C., a pressure of 60 Pa, a $SiH_4/B_2H_6$ flow ratio of 1/3 and a power density supply of 0.01 W/cm². The $B_2H_6$ gas flow rate mentioned above is a flow rate of a diluting gas wherein $B_2H_6$ concentration was diluted to 5000 ppm using $H_2$ gas.

Next, on the intrinsic silicon-based layer 2, a silicon nitride layer was formed to have a thickness of 60 nm as a light-receiving-side protecting layer 4. Thereafter, on the p-type semiconductor layer 6, an intrinsic amorphous silicon layer was formed to have a thickness of 12 nm as an underlying protecting layer 8b, and a silicon oxide layer was formed thereon to have a thickness of 260 nm as an insulating layer 8a. Deposition condition for forming the silicon nitride layer included a substrate temperature of 140° C., a pressure of 80 Pa, a $SiH_4/NH_3$ flow ratio of 1/4, and a power density supply of 0.2 W/cm². Deposition conditions for forming the silicon oxide layer included, a substrate temperature of 150° C., a pressure of 60 Pa, a $SiH_4/CO_2$ flow ratio of 1/40, and a power density supply of 0.04 W/cm².

The insulating layer 8a was partially etched with an HF aqueous solution, and the intrinsic amorphous silicon layer as the underlying protecting layer 8b exposed under the insulating layer 8a was then partially removed by etching with a KOH aqueous solution. Thereafter, the p-type semiconductor layer 6 and the intrinsic silicon-based layer 5a exposed under the underlying protecting layer 8b were etched with a mixed acid of HF and $HNO_3$ to expose the first principal surface of the crystalline silicon substrate.

The surface of the substrate was washed with an HF aqueous solution. Thereafter, the substrate was introduced into a CVD apparatus to deposit an i-type amorphous silicon layer in a thickness of 8 nm as an intrinsic silicon-based thin-film 5b on the first principal surface-side of the substrate, and to dumpsite thereon an n-type amorphous silicon layer in a thickness of 12 nm as an n-type semiconductor layer 7. Deposition conditions for forming the n-type amorphous silicon layer included a substrate temperature of 150° C., a pressure of 60 Pa, a $SiH_4/PH_3$ flow ratio of 1/3 and a power density supply of 0.01 W/cm². The $PH_3$ gas flow rate mentioned above is a flow rate of a diluting gas wherein $PH_3$ concentration was diluted to 5000 ppm using $H_2$ gas.

The n-type semiconductor layer 7 and the intrinsic silicon-based layer 5b provided on the insulating layer 8a were partially etched with a KOH aqueous solution, and the insulating layer 8a exposed under the layers was then etched with an HF aqueous solution. Thereafter, the intrinsic amorphous silicon layer as the underlying protecting layer 8b exposed under the insulating layer 8a was removed by etching with a KOH aqueous solution to expose the surface of the p-type semiconductor layer 6.

Next, an indium tin oxide (ITO) layer was formed in a thickness of 80 nm on substantially the entire of the first principal surface except for the peripheral edge thereof. For the formation of the ITO layer, a mixed sintered target of indium oxide and tin oxide was used, and a power of 0.5 W/cm² was applied in an argon atmosphere at a pressure of 0.2 Pa with the substrate temperature set to room temperature. Using hydrochloric acid, the ITO layer was partially etched away to perform patterning, so that the ITO layer was separated into first electrodes 9a and 9b.

Finally, an Ag paste was applied onto the first electrodes 9a and 9b by screen printing to form second electrodes 10a and 10b.

Comparative Example

The underlying protecting layer 8b (intrinsic amorphous silicon layer) was not formed, only a silicon oxide layer was formed as the protecting layer 8 on the p-type semiconductor layer 6, and the step of etching the underlying protecting layer 8b was omitted. Except these changes, the same procedure as in the Example was carried out to prepare a crystalline silicon solar cell.

[Evaluation]

The conversion properties (open circuit voltage Voc, current density Isc and fill factor FF) of the obtained crystalline silicon solar cells in the Example and the Comparative Example were measured. The solar cell in the Example had an open circuit voltage Voc higher by a factor of 1.06 than that in the Comparative Example, a current density Isc higher by a factor of 1.02 than that in the Comparative Example, and a fill factor FF higher by a factor of 1.31 than that in the Comparative Example, and was thus superior in all the properties to the solar cell in the Comparative Example. These results show that the properties of a back-contact type solar cell can be improved by providing an underlying protecting layer between the p-type semiconductor layer and the insulating layer.

The solar cell in the Example was considerably superior in FF (fill factor) to the solar cell in the Comparative Example. This may be because in the Example, the hydrofluoric acid etchant used during etching of the silicon oxide layer as an insulating layer was not in contact with the p-type semiconductor layer, and therefore contact between the p-type amorphous silicon layer as a p-type semiconductor layer and the ITO layer as a first electrode was enhanced. Further, the leak current between p-type and n-type layers was reduced because the protecting layer had a stacking configuration of the intrinsic amorphous silicon layer as an underlying protecting layer and the silicon oxide layer as an insulating layer. This may also contribute to improvement of the properties.

DESCRIPTION OF REFERENCE CHARACTERS 1 crystalline silicon substrate
2 intrinsic silicon-based layer
3 conductive semiconductor layer
4 light-receiving-side protecting layer
5a, 5b intrinsic silicon-based layer
6 p-type semiconductor layer
7 n-type semiconductor layer
8 protecting layer
8a insulating layer
8b underlying protecting layer (intrinsic silicon-based layer or/and n-type silicon-based layer)
9a, 9b first electrode
10a, 10b second electrode

The invention claimed is:
1. A method for manufacturing a solar cell, the solar cell including an n-type semiconductor layer and a p-type semiconductor layer on a first surface of a crystalline silicon substrate, the method comprising:

a pattern layer forming step of forming a p-type semiconductor layer-formed region and a p-type semiconductor layer-non-formed region on the first surface of the crystalline silicon substrate, wherein the p-type semiconductor layer-formed region includes the p-type semiconductor layer and a protecting layer in this order on the first surface of the crystalline silicon substrate, and the p-type semiconductor layer-non-formed region includes neither the p-type semiconductor layer nor the protecting layer on the first surface of the crystalline silicon substrate;

an n-type semiconductor layer forming step of forming the n-type semiconductor layer so as to cover an entire surface of both the p-type semiconductor layer-formed region and the p-type semiconductor layer-non-formed-region;

an n-type semiconductor layer patterning step partially removing the n-type semiconductor layer on the p-type semiconductor layer-formed region so that a part of the protecting layer beneath the removed n-type semiconductor layer is exposed between the n-type semiconductor layers; and a protecting layer patterning step of removing the exposed protecting layer between the n-type semiconductor layers so that a part of the p-type semiconductor layer beneath the removed protecting layer is exposed between the n-type semiconductor layers, wherein the protecting layer includes: an underlying protecting layer that is in contact with the p-type semiconductor layer, and an insulating layer arranged on top of the underlying protecting layer so that the p-type semiconductor layer, the underlying protecting layer and the insulating layer are arranged in this order, and the underlying protecting layer including at least one selected from the group consisting of an intrinsic silicon-based layer and an n-type silicon-based layer, wherein in the protecting layer patterning step, the insulating layer is removed using a first etchant, after removing the insulating layer, the underlying protecting layer is removed using a second etchant, the first etchant exhibits a higher etching rate for the insulating layer than that for the underlying protecting layer, and the second etchant exhibits a higher etching rate for the underlying protecting layer than for the p-type semiconductor layer.

2. The method according to claim 1, wherein the insulating layer includes at least one silicon alloy selected from the group consisting of silicon oxide, silicon nitride and silicon oxynitride.

3. The method according to claim 1, wherein the second etchant exhibits a higher etching rate for the underlying protecting layer than that for the insulating layer.

4. The method according to claim 1, wherein the first etchant is an acid-based etchant.

5. The method according to claim 4, wherein the acid-based etchant contains hydrofluoric acid.

6. The method according to claim 1, wherein the second etchant is an alkali-based etchant.

7. The method according to claim 6, wherein the alkali-based etchant contains at least one selected from the group consisting of KOH and NaOH.

8. The method according to claim 1, wherein the underlying protecting layer is an intrinsic silicon-based layer.

9. The method according to claim 1, wherein the p-type semiconductor layer is a p-type silicon-based layer.

10. The method according to claim 1, wherein the pattern layer forming step further comprising:

a p-type semiconductor layer forming step of forming the p-type semiconductor layer on the first surface of the crystalline silicon substrate;

a protecting layer forming step of forming the protecting layer on the p-type semiconductor layer; and a p-type semiconductor layer patterning step of removing the p-type semiconductor layer exposed between the protecting layers.

11. The method according to claim 10, wherein a p-layer exposure patterning step is further performed between the protecting layer forming step and the p-type semiconductor layer patterning step, in the p-layer exposure patterning step, the protecting layer is partially removed such that the p-type semiconductor layer is exposed between the protecting layers.

* * * * *